(12) United States Patent
Boehl et al.

(10) Patent No.: US 9,602,109 B2
(45) Date of Patent: Mar. 21, 2017

(54) METHOD AND CIRCUIT CONFIGURATION FOR DETERMINING POSITION MINUS TIME

(75) Inventors: Eberhard Boehl, Reutlingen (DE);
Andreas Hempel, Ludwigsburg (DE);
Dieter Thoss, Schwieberdingen (DE);
Ruben Bartholomae, Reutlingen (DE);
Stephen Schmitt, Nuertingen (DE);
Andreas Merker, Vaihingen/Enz (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1068 days.

(21) Appl. No.: 13/637,113

(22) PCT Filed: Mar. 16, 2011

(86) PCT No.: PCT/EP2011/053981
§ 371 (c)(1),
(2), (4) Date: Dec. 10, 2012

(87) PCT Pub. No.: WO2011/120808
PCT Pub. Date: Oct. 6, 2011

(65) Prior Publication Data
US 2013/0076397 A1    Mar. 28, 2013

(30) Foreign Application Priority Data

Mar. 31, 2010 (DE) .......... 10 2010 003 539

(51) Int. Cl.
*H03K 99/00* (2013.01)
*F02D 41/00* (2006.01)
(Continued)

(52) U.S. Cl.
CPC .......... *H03K 99/00* (2013.01); *F02D 41/009* (2013.01); *F02D 41/0097* (2013.01);
(Continued)

(58) Field of Classification Search
CPC ... H03K 99/00; F02D 41/009; F02D 41/0097; F02D 41/401; G05B 13/026; G05B 2219/2623; F02B 77/087; F02B 3/12
See application file for complete search history.

(56) References Cited

U.S. PATENT DOCUMENTS 4,292,941 A * 10/1981 Suzuki ............... F02P 7/067
                                                   123/406.64
4,384,560 A *  5/1983 Jager ............... F02M 59/447
                                                   123/380

(Continued)

FOREIGN PATENT DOCUMENTS

CN          1209889          3/1999
CN          1514961          7/2004

(Continued)

OTHER PUBLICATIONS

International Search Report for PCT/EP2011/053981, dated Jul. 8, 2011.

*Primary Examiner* — Alexander Satanovsky
*Assistant Examiner* — John Kuan
(74) *Attorney, Agent, or Firm* — Gerard Messina

(57) ABSTRACT

A circuit configuration for a data processing system for predicting a coordinate for at least one operation to be carried out is provided, the prediction being connected to at least one input signal and being a function of a predefined first time value and at least one predefined first value which represents another physical variable. Upon each change of the at least one input signal, a second time value is calculated in each case from the first value, and to subtract the first time value from the second time value to form a third time value, and/or to calculate a second value from the first time value, and to subtract the first value from the second value to form a third value, in order to determine from the third time value (Continued)

and/or the third value a state in which the at least one operation is to be carried out.

10 Claims, 1 Drawing Sheet

(51) Int. Cl.
    *G05B 13/02*     (2006.01)
    *F02B 3/12*     (2006.01)
    *F02B 77/08*     (2006.01)
    *F02D 41/40*     (2006.01)

(52) U.S. Cl.
    CPC .............. *G05B 13/026* (2013.01); *F02B 3/12* (2013.01); *F02B 77/087* (2013.01); *F02D 41/401* (2013.01); *G05B 2219/2623* (2013.01)

(56) References Cited

U.S. PATENT DOCUMENTS

| | | | |
|---|---|---|---|
| 5,581,022 A * | 12/1996 | Sprague | G01M 15/11 123/436 |
| 6,367,456 B1 * | 4/2002 | Barnes | F02D 41/062 123/179.17 |
| 7,577,511 B1 * | 8/2009 | Tripathi | F02D 41/0087 701/103 |
| 2004/0128055 A1 | 7/2004 | Jaliwala et al. | |
| 2010/0042309 A1 * | 2/2010 | Polach | F02D 35/025 701/105 |

FOREIGN PATENT DOCUMENTS

| | | |
|---|---|---|
| DE | 10 2004 059364 | 7/2005 |
| DE | 10 2005 057571 | 6/2007 |
| EP | 1 830 057 | 9/2007 |
| JP | 2009-517591 | 4/2009 |
| WO | WO 02/25237 | 3/2002 |
| WO | WO 2009/143858 | 12/2009 |
| WO | WO 2011/120808 | 10/2011 |

* cited by examiner

METHOD AND CIRCUIT CONFIGURATION FOR DETERMINING POSITION MINUS TIME

BACKGROUND OF THE INVENTION

1. Field of the Invention

The present invention relates to a circuit configuration and a corresponding method for implementing a mechanism for simple determination of position minus time in a complex command sequence.

2. Description of the Related Art

In presently known engine control units, often only a complex software architecture and very complex control algorithms are available, which require extensive computing resources. The available control algorithms must typically process highly dynamic input data and calculate output parameters, which also incorporate physical characteristics of particular actuators. Such an output parameter is, for example, in the case of activation of an actuator, the inertia or delay characteristic of the actuator, which makes it necessary, for example, a certain time before an engine reaches a specific rotational angle at which an event is to occur, to trigger this event or an operation associated therewith. The engine is to rotate at different speeds depending on the acceleration or deceleration, so that the rotational angle (position) will in turn be reached at a different point in time as a function thereof. The point in time assigned to the rotational angle therefore changes depending on the change of the parameter. A so-called position minus time calculation permits it to predict when, based on instantaneous time or state parameters, a state is reached in which a planned operation to be carried out is to be carried out or must be triggered.

For example, it is conceivable that in the case of an injection pump, the particular injection as a function of a particular acceleration or deceleration of the engine may always only occur in a specific angle position of the shaft coupled to the injection pump, so that it may be predicted based on a present instantaneous state of the shaft when the corresponding angle position will be reached, so that the injection may occur then. In this case, however, the above-mentioned inertia or delay characteristic of the actuator is to be considered, and also the overall state of all parameters influencing this operation to be carried out, for example, an acceleration or deceleration of the engine itself.

So-called position minus time calculations were heretofore typically carried out in software and distinguished in that the position minus time calculation is recalculated until an optimum position/time value is known. However, this requires a rapid interrupt behavior of the CPU to be available to the system and additionally claims a large amount of computing time. This becomes a problem in particular when there are high engine speeds.

Against this background, it is an object of the present invention to remedy the above-described disadvantages of the software-based position minus time calculation and in contrast thereto to provide a reliable calculation of the corresponding values even at high engine speeds and simultaneously to relieve the CPU available to the system as much as possible from a high interrupt load and complex calculations.

BRIEF SUMMARY OF THE INVENTION

The circuit configuration provided according to the present invention and also the method provided according to the present invention may be implemented, for example, in a data processing architecture and may relieve a CPU available to the data processing system in a suitable way. Suitable specific embodiments of the circuit configuration presented according to the present invention and the method presented according to the present invention result from the particular dependent claims and the description.

A circuit configuration is provided for a data processing system for predicting a coordinate, for example, a point in time or an angle, for at least one operation to be carried out, the prediction being connected to at least one input signal, for example, a sensor signal of a sensor wheel, and being a function of a predefined first time value and at least one predefined first value which represents another physical variable. The provided circuit configuration is configured for the purpose, upon each change of the at least one input signal, of calculating a second time value from the first value in each case with the aid of particular instantaneous time parameters and/or other state parameters, such as a rotational speed, and to subtract the first time value from the second time value to form a third time value and/or to calculate a second value from the first time value and to subtract the second value from the first value to form a third value, in order to determine from the third time value and/or the third value a state in which the at least one operation is to be triggered.

The predefined first time value may be, for example, a delay period, which reflects an inertia of a corresponding actuator. This delay period or the first time value is also to be taken into consideration in a calculation or a prediction of when an operation is to be triggered. The predefined first value of another physical variable may be, for example, a predefined angle position of a shaft, in which the operation to be carried out is to be carried out. It may be that the operation to be carried out may only be carried out in one or a few specific angle positions of a corresponding shaft, so that these angle positions are accordingly predefined and are incorporated in the calculation in each case as the predefined first value mentioned here, which represents another physical variable. Therefore, based on, for example, an instantaneous time value or an instantaneous angle position, it may be determined when, without consideration of the inertia or delay period of the actuator, the certain angle position of the shaft, specifically the angle position corresponding to the predefined first value, is initially reached, whereby the second time value is determined. However, if one additionally also considers the delay period, in accordance with the first time value, this first time value must be subtracted from the second calculated time value to be able to ascertain which time period remains corresponding to the third time value until the operation to be carried out must be initiated or triggered.

Such a determination may alternatively also be carried out based on the first time value, namely in that, based on the first time value, in accordance with the delay period of the corresponding actuator, an angular rotation covered in this time and along with it an angle position are determined, this angle position is subtracted from the predefined angle position, which indicates when the operation to be carried out is actually to be executed, and therefore an angle position is obtained as the third value, which specifies that as soon as this angle position is reached, the operation to be carried out is to be initiated. This means that from the calculated third values, whether it is the third time value and/or the third value of another physical variable, a state may be determined in which the at least one operation is to be triggered or initiated.

In one possible specific embodiment of the proposed circuit configuration, it is also provided that the third value is to be determined from the third time value or the third time value is to be determined from the third value and at least one of the values, third time value or third value, is to be relayed to an output unit. The output unit may be part of the proposed circuit configuration or may be externally coupled to the circuit configuration in a suitable way.

It is conceivable that the output unit is designed for the purpose of comparing the obtained third time value to a time base and/or comparing the obtained third value of the other physical variable to a corresponding base of the other physical variable and to change a corresponding output signal as a function of such a comparison that has been carried out.

Furthermore, it is conceivable that the circuit configuration transfers a fourth time value and/or a fourth value of the other physical variable to the output unit, in order to consider the fourth time value or the fourth value of the other physical variable for a change of an output signal.

It is conceivable that the circuit configuration is configured for the purpose of transferring at least one additional control signal to the output unit, which decides which of the third or fourth values is to be compared to the time base or to another base of the other physical variable.

It is conceivable that the output unit is configured for the purpose of outputting a status signal, which provides information about the decision for the third or fourth values.

Furthermore, in another specific embodiment of the circuit configuration proposed according to the present invention, it is provided that the output unit includes a control bit and is configured for the purpose of switching over a comparison unit, which is configured to carry out a comparison for the base of the other physical variable, between a first comparison mode and a second comparison mode as a function of the control bit, "greater than" or "greater than/equal to" being compared in the first comparison mode and "less than" or "less than/equal to" being compared in the second comparison mode.

Furthermore, the present invention relates to a method for a data processing system for predicting at least one operation to be carried out, the prediction being connected to at least one input signal and being a function of a predefined first time value and at least one predefined first value which represents another physical variable. The method includes all steps which may be carried out by a proposed circuit configuration as introduced above.

It is understood that the above-mentioned features and the features to be explained hereafter are usable not only in the particular specified combination, but rather also in other combinations or alone, without departing from the scope of the present invention.

DETAILED DESCRIPTION OF THE INVENTION

Figure 1:
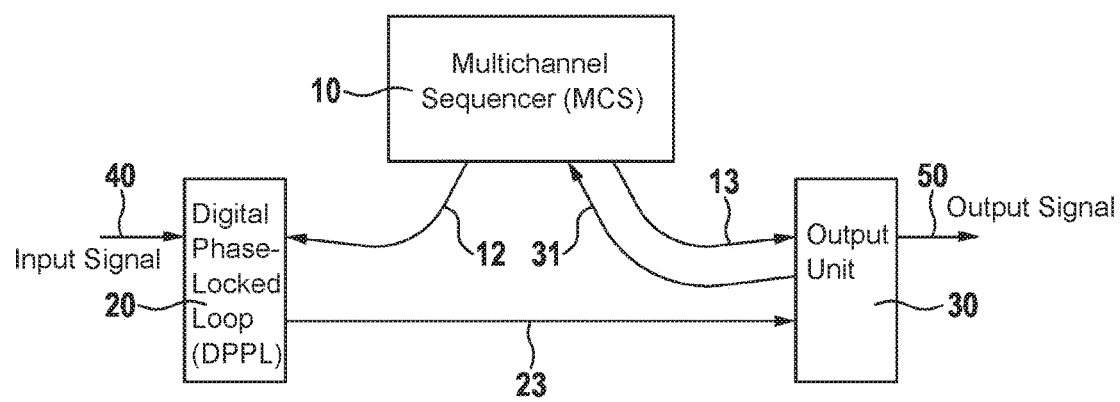
FIG. 1 shows one specific embodiment of the underlying structure of the circuit configuration according to the present invention for carrying out a position minus time calculation.

The present invention is schematically shown on the basis of specific embodiments in the drawings and will be schematically described in greater detail with reference to the drawings. A detailed description of construction and function will be provided.

The method proposed according to the present invention and the circuit configuration proposed according to the present invention may be implemented, for example, in a combination of a multichannel sequencer (MCS) 10, an output unit 30, and a digital phase locked loop (DPLL) 20. This architecture is described in greater detail hereafter as a possible specific embodiment of the circuit configuration proposed according to the present invention. This means that in this specific embodiment the circuit configuration includes a processing unit, for example, a multichannel sequencer 10, a DPLL unit 20, and an output unit 30.

In order to be able to carry out an operation to be carried out, for example, desired position values to be assumed, at which the operation is to be carried out, and corresponding offset values with respect to time must initially be determined. The desired position values to be assumed are each represented by a first value of another physical variable. The offset values with respect to time each correspond to a first time value. To specify these values, a CPU (central processing unit) available to the system analyzes corresponding boundary conditions, such as rotational speed, temperature, battery voltage, rail pressure, and exhaust gas values. The corresponding values and also boundary conditions are transmitted to multichannel sequencer MCS 10. MCS 10 decides whether an immediate operation is to be executed due to possible overriding conditions (time or angle values may be so close in the future that a calculation result would only be provided too late) and in this case transmits values directly via a corresponding routing unit (ARU—advanced routing unit) to an output unit 30 (ATOM—advanced timer output module).

The output of MCS 10 to ATOM 30 is shown symbolically in FIG. 1 via signal path 13.

In contrast, if position minus time calculations are necessary, i.e., if sufficient time still remains for the calculation, multichannel sequencer 10 transmits position and time values via a routing unit (ARU) to shown DPLL unit 20. The output of MCS 10 to DPPL unit 20 is symbolically shown in FIG. 1 via a signal path 12. DPLL unit 20 calculates from a predefined position value, such as an angle value as the mentioned first value, and the rotational speed information ascertained in DPLL unit 20 (time interval of the last two relevant input changes), a time value at which the angle value or position value would exist and subtracts a predefined first time value therefrom in accordance with, for example, a delay period. This third time value calculated in this way now corresponds to the time value according to which the operation to be carried out is to be initiated or triggered, so that the operation to be carried out is actually carried out at the predefined position value or the angle value as the predefined first value. Alternatively, it is also possible to determine, from the predefined time value in accordance with the first time value, a second angle value or position value, which is to be subtracted from the first angle value to thus obtain a third angle value, which indicates by which position the operation to be carried out must be initiated so that it is actually carried out at the predefined angle value according to the first value. This calculated third time value and/or the calculated angle value also associated with this time value as the third value may be provided by DPLL unit 20 via the routing unit (ARU) to an output unit 30. The output from DPLL unit 20 to ATOM 30 is symbolically shown in FIG. 1 via signal path 23.

Figure 2:
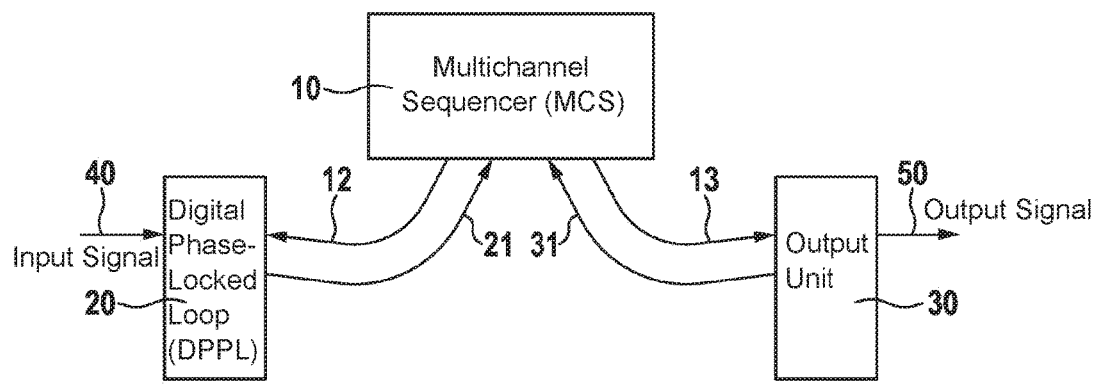
FIG. 2 shows another specific embodiment of the circuit configuration according to the present invention.

The connection between DPLL unit 20 and ATOM 30 may also occur indirectly via MCS 10, as symbolically shown in FIG. 2 via signal paths 21 and 13. For this purpose, the output value of DPLL unit 20 is initially transmitted to multichannel sequencer 10 with the aid of symbolically shown signal path 21 and subsequently multichannel sequencer 10 transmits these data, after it has possibly also modified them, via symbolically shown signal path 13 to output unit 30. Output unit 30 may generate a corresponding output signal based on the third time value or the third angle value, which provides information about when, i.e., at which position or at which point in time, the operation to be carried out is to be initiated. On the route from DPLL unit 20 via multichannel sequencer 10 to ATOM 30, multichannel sequencer 10 may also replace the third time value with another angle value or the third value with another time value. The output of the output unit is symbolically shown by signal path 50 in FIGS. 1 and 2.

However, it is possible that due to changes, for example, in the rotational speed as a result of accelerations or decelerations, the above-mentioned performed calculations deviate more or less from the conditions now actually existing. Therefore, it may be provided that any information which permits greater precision and therefore makes the prediction more exact is analyzed in DPLL unit 20. Thus, for example, new values from a sensor wheel of a crankshaft are suited for making rotation time information and predicted values corresponding thereto more precise, which are used for the purpose of initiating operations to be performed in a timely manner. These values are provided as input signal 40 to DPLL unit 20.

If the calculated time value corresponding to the third time value according to the proposed circuit configuration is in the future, a recalculation is therefore performed with each new input information, so that the output signals which are finally output are always optimally adapted by the output unit to the present conditions.

It is to be noted that DPLL unit 20 does not decide whether it is necessary to respond to a value calculated thereby, whether it is a time value or position value or a value of another physical variable, but rather sends these calculated values, possibly also in still imprecise form and lying far in the future, to output unit 30. It is then checked in output unit 30, according to one specific embodiment of the proposed circuit configuration, whether the predefined position and/or time values have already been reached, in order to respond appropriately with a signal change at the output. At the same time, output unit 30 continuously requests recalculated values from DPLL unit 20.

Furthermore, it is conceivable that a fourth time value and/or a fourth position value is/are transferred by the circuit configuration to output unit 30, in order to consider the fourth time value or the fourth position value for a change of an output signal.

It is conceivable that the circuit configuration is configured for the purpose of transferring to output unit 30 at least one additional control signal, which decides which of the third or fourth time values are to be compared to the time base or which of the third or fourth position values are to be compared to a corresponding angle base.

It is conceivable that output unit 30 is configured for the purpose of outputting a status signal, which is indicated by signal path 31 in FIGS. 1 and 2 and which provides information about the decision for the third or fourth corresponding values.

In contrast to other sources or modules coupled to the routing unit (ARU), DPLL unit 20 may also be designed as a non-blocking source, in the meaning of a data source, which also permits multiple reads of identical information. It is thus also possible that multichannel sequencer 10 and other units also retrieve the same information as output unit 30 from DPLL unit 20, without having to accept a delay due to another broadcast unit to be provided.

As soon as DPLL unit 20 has calculated new values, i.e., the mentioned third time values or values of another physical variable and these have been transmitted indirectly or directly to ATOM 30, these new values are automatically used in output unit 30 for a comparison to be carried out therein. In output unit 30, the values transmitted by DPLL unit 20 are compared in relation to a corresponding value base. This means that calculated time values are compared in relation to a time base and values of another physical variable are compared in relation to a corresponding base of the other physical variable. This comparison is then used to output a corresponding output signal or to check whether a change of the output signal must be performed as a function of such a comparison. Finally, a change of the output signal will typically fulfill a change of the input signal. This means that, for example, upon pressing on a gas pedal to accelerate an engine, an output signal is output to the CPU as a further input signal, for example, which has the effect that finally more fuel is accordingly injected at certain times, as described in greater detail hereafter. The acceleration resulting therefrom is reflected in input signal 40 of DPLL unit 20, in that the sensor signals arrive from the sensor wheel at higher frequency.

When, as already mentioned above, a stronger acceleration is desired and therefore more fuel is to be injected, new position minus time values are possibly also to be specified by a CPU available to the system. DPLL unit 20 receives new values via multichannel sequencer 10, even if the heretofore calculated values, i.e., the third time value and/or the third value of the other physical variable, are still in the future, i.e., have not yet been reached by the system. These values, which have become obsolete in the meantime, are replaced in DPLL unit 20 and new time values are calculated as third time values or new position values are calculated as third values of another physical variable. For reasons of data consistency, it is possible to receive new position minus time values only when no calculations are presently taking place inside DPLL unit 20. A recalculation may only start under certain circumstances if a new input is provided from the sensor signals, for example, from the sensor wheel of a crankshaft, because other important calculations take place with this event, which may not be missed. Thus, for example, the input signal change must be responded to immediately with the output of impulses for the base of the second physical unit. However, the way in which this immediate response may be achieved is a function of the implementation of DPLL unit 20. A sufficient time is only available for a calculation of new time or position values after these calculations have taken place, until a new input event must be expected again. However, implementations of DPLL unit 20 are also possible which may process new position time values continuously after a first calculation, independently of whether a new input signal change has occurred in the interim.

In the case of non-blocking implementation, the calculated third time values or position values are provided via the routing unit (ARU) for output unit 30 until the calculated time values are in the past or the calculated values of the other physical variables, such as position values, have been reached. No further value is typically output until new position minus time specifications have resulted in a recalculation. In the case of a blocking implementation, each recalculated value is only provided once. As soon as the value has been retrieved from ATOM 30, for example, it is no longer provided until a recalculation has taken place due to new input signals or new position-time values.

It is also possible to convert the particular calculated time values into corresponding position values and then to subtract these calculated position values from the predefined position values. It is checked thereafter in output unit 30 whether this calculated position value has been reached.

In order to be able to intervene very late in the sequence of a position minus time calculation and the output of output signals based thereon, a corresponding CPU must be made capable of controlling the output directly via output unit 30. A locking mechanism is provided for this purpose in output unit 30, which may interrupt a continuous reloading of values from the routing unit (ARU) and may instead accept values from the CPU. For such an intervention of the CPU in the sequence of the output unit, there is a write request bit WR_REQ, which the CPU sets when it wishes to write, for example, new comparison values into an operation register of output unit 30. The comparison values, which output unit 30 has already received from the routing unit (ARU) and are characterized by a set data valid bit (DV—data valid), are not discarded, however, but rather output unit 30 continues to compare the comparison values stored in a corresponding comparison register, but does not request further newer comparison values from the routing unit (ARU). The CPU may now write the new comparison values into shadow registers of output unit 30 and signal via a force update bit (FORC_UPDATE) to output unit 30 that the output unit may accept the comparison values in corresponding comparison registers.

If mentioned write request bit WR_REQ is set and a comparison event occurs, output unit 30 blocks any write access to shadow and comparison registers and the instantaneous time and position values are accepted in the shadow registers. If the CPU has not yet set the mentioned force update bit (FORC_UPDATE), this is indicated or signaled via a write failed bit (WRF—write failed). The WR_REQ and DV bits are reset by the corresponding hardware in the event of a comparison event.

The CPU may recognize that its late "update" of the comparison values was successful if the bits WR_REQ, DV, and WRF are not set after its force update request. If the WRF bit is set, the force update of the CPU was not successful.

Furthermore, it is possible that the calculation of position values in particular may be used both for forward running and also for reverse running. Comparison values for the output unit for the time base are independent of whether forward running or reverse running takes place. However, this does not apply for position values and their corresponding base, because these always decrease in the case of reverse running. This means that in order to be able to compare to a position predefined for the future, in the case of reverse running, a comparison must therefore be made to "less than" or to "less than or equal to", while in the case of forward running, a comparison is made to "greater than" or "greater than or equal to". An additional control signal is provided for the purpose of indicating the direction and therefore switching over the comparison module provided in the output unit. If angle-time calculations of DPLL unit 20 relate to a time value to be compared, no changes result in relation to the forward running, only in the case of a comparison to be made of a position optionally also to be calculated as a value of another physical variable.

What is claimed is:

1. A circuit configuration for a data processing system for predicting a coordinate for at least one operation to be carried out, wherein the prediction is dependent on at least one input signal, a predefined first time value and at least one predefined first physical value which represents another physical variable, comprising:
   a processing device of the data processing system, wherein upon each change of the at least one input signal, the processing device of the data processing system performs:
   calculating a second time value from the predefined first physical value with the aid of at least one of an instantaneous time and another state parameter,
   at least one of (i) subtracting the predefined first time value from the second time value to form a third time value, and (ii) calculating a second physical value from the first time value,
   subtracting the first physical value from the second physical value to form a third physical value;
   determining, based on at least one of the third time value and the third physical value, a state in which the at least one operation is to be triggered; and
   transmitting the state to a unit that triggers the at least one operation based on the transmitted state;
   wherein the processing device includes:
      a multichannel sequencer which identifies the each change of the at least one input signal and transmits, upon identification of the each change, the predefined first time value, the instantaneous time, and the another state parameter; and
      a digital phase locked loop which:
         receives the predefined first time value, the instantaneous time, and the another state parameter from the multichannel sequencer,
         receives the at least one input signal from a sensor associated with a component generating the at least one input signal,
         calculates the second time value,
         at least one of: (i) subtracts the predefined first time value from the second time value to form the third time value, and (ii) calculates the second physical value from the first time value,
         subtracts the first physical value from the second physical value to form the third physical value, and
         transmits at least one of the third time value and the third physical value.

2. The circuit configuration as recited in claim 1, wherein:
   the output unit includes a control bit;
   a comparison unit is configured to carry out a comparison of the at least one predefined first physical value to a reference value for the another physical variable; and
   the output unit is configured to switch over, as a function of the control bit, the comparison unit between (i) a first comparison mode in which greater-than-or-equal-to relationship is tested, and (ii) a second comparison mode in which less-than-or-equal-to relationship is tested.

3. The circuit configuration as recited in claim 1, wherein the processing device further includes:
   an output unit which:
      receives the at least one of the third time value and the third physical value from the digital phase lock loop,
      determines the state in which the at least one operation is to be triggered, and transmits the state to at least one of the unit that triggers the at least one operation and a communicatively coupled central processing unit (CPU).

4. The circuit configuration as recited in claim 3, wherein the output unit is configured as an advanced timer output module, and wherein the advanced timer output module continuously requests that the digital phase lock loop recalculates at least one of the third time value and the third physical value.

5. A circuit configuration for a data processing system for predicting a coordinate for at least one operation to be carried out, wherein the prediction is dependent on at least one input signal, a predefined first time value and at least one predefined first physical value which represents another physical variable, comprising:
   a processing device of the data processing system, wherein upon each change of the at least one input signal, the processing device of the data processing system performs:
   calculating a second time value from the predefined first physical value with the aid of at least one of an instantaneous time and another state parameter,
   at least one of (i) subtracting the predefined first time value from the second time value to form a third time value, and (ii) calculating a second physical value from the first time value,
   subtracting the first physical value from the second physical value to form a third physical value;
   determining, based on at least one of the third time value and the third physical value, a state in which the at least one operation is to be triggered; and
   transmitting the state to a unit that triggers the at least one operation based on the transmitted state;
   wherein the circuit configuration is further configured to:
   (a) determine one of (i) the third physical value from the third time value, or (ii) the third time value from the third physical value, and (b) relay at least one of the third time value or third physical value to an output unit;
   wherein the output unit is configured to perform the following: (a) at least one of (i) comparing the third time value to a reference time base value, and (ii) comparing the third physical value to a reference physical value; and (b) changing an output signal as a function of at least one of the comparisons;
   wherein the processing device includes:
   a multichannel sequencer which identifies the each change of the at least one input signal and transmits, upon identification of the each change, the predefined first time value, the instantaneous time, and the another state parameter;
   a digital phase locked loop which:
   receives the predefined first time value, the instantaneous time, and the another state parameter from the multichannel sequencer,
   receives the at least one input signal from a sensor associated with a component generating the at least one input signal,
   calculates the second time value,
   at least one of: (i) subtracts the predefined first time value from the second time value to form the third time value, and (ii) calculates the second physical value from the first time value,
   subtracts the first physical value from the second physical value to form the third physical value, and
   transmits at least one of the third time value and the third physical value; and
   an output unit which:
   receives the at least one of the third time value and the third physical value from the digital phase lock loop,
   determines the state in which the at least one operation is to be triggered, and
   transmits the state to at least one of the unit that triggers the at least one operation and a communicatively coupled central processing unit (CPU).

6. The circuit configuration as recited in claim 5, wherein the circuit configuration is further configured to transfer at least one of a fourth time value and a fourth physical value to the output unit so that at least one of the fourth time value and the fourth physical value is taken into consideration for changing the output signal.

7. The circuit configuration as recited in claim 6, wherein the circuit configuration is further configured to transfer at least one additional control signal to the output unit, and wherein the at least one additional control signal dictates which of the third time value, the third physical value, the fourth time value or the fourth physical value is to be compared to a respective reference value.

8. The circuit configuration as recited in claim 7, wherein the output unit is further configured to output a status signal which provides information about which of the third time value, the third physical value, the fourth time value or the fourth physical value is to be compared to a respective reference value.

9. The circuit configuration as recited in claim 5, wherein the CPU includes a locking mechanism that controls when the output unit transmits the state.

10. The circuit configuration as recited in claim 9, wherein:
   the output unit replaces at least one of the reference physical value and the reference time base value stored in an operation register of the output unit upon receipt of a write request bit from the locking mechanism of the CPU.

* * * * *